(12) United States Patent
Sunwoo et al.

(10) Patent No.: US 6,946,320 B2
(45) Date of Patent: Sep. 20, 2005

(54) FBAR BASED DUPLEXER DEVICE AND MANUFACTURING METHOD THEREOF

(75) Inventors: Kook Hyun Sunwoo, Choongchungnam-do (KR); Jong Oh Kwon, Kyungki-do (KR)

(73) Assignee: Samsung-Electro Mechanics Co., Ltd., Kyungki-do (KR)

(*) Notice: Subject to any disclaimer, the term of this patent is extended or adjusted under 35 U.S.C. 154(b) by 0 days.

(21) Appl. No.: 10/754,578

(22) Filed: Jan. 12, 2004

(65) Prior Publication Data

US 2005/0070045 A1 Mar. 31, 2005

(30) Foreign Application Priority Data

Sep. 29, 2003 (KR) .................... 10-2003-0067412

(51) Int. Cl.[7] .................... H01L 21/44; H01L 21/50
(52) U.S. Cl. .................... 438/106; 438/112
(58) Field of Search .................... 438/106, 26, 51, 438/54, 66, 107, 108, 118, 119, 122, 124, 126, 127

(56) References Cited

U.S. PATENT DOCUMENTS

| | | | |
|---|---|---|---|
| 6,336,276 B1 * | 1/2002 | Krajec et al. ............ 33/645 |
| 6,407,649 B1 * | 6/2002 | Tikka et al. ............ 333/133 |
| 6,472,954 B1 * | 10/2002 | Ruby et al. ............ 333/133 |
| 6,509,813 B2 * | 1/2003 | Ella et al. ............ 333/187 |
| 6,778,038 B2 * | 8/2004 | Takeishi et al. ............ 333/133 |

* cited by examiner

*Primary Examiner*—David Nhu
(74) *Attorney, Agent, or Firm*—Lowe Hauptman & Berner, LLP

(57) ABSTRACT

Disclosed herein is an FBAR based duplexer device and a manufacturing method thereof, which can achieve miniaturization, and reduction of a manufacturing cost and enhancement of a yield due to a simplified process. According to the present invention, first, a plurality of FBAR chips are prepared. Each of the FBAR chips includes a substrate, air gaps and piezoelectric layer unit; which are successively arranged, a plurality of electrode pads electrically connected to the piezoelectric layer unit, and bump balls formed on the electrode pads in a one to one ratio. Then, a duplexer substrate having a duplexing circuit is prepared, and a plurality of the FBAR chips come into contact with the duplexer substrate. In this state, they are reversed so that the substrates of the FBAR chips face upward, and the bump balls are bonded to the duplexer substrate. After that, protective structures are formed by the use of a film, so as to be positioned on side surfaces as well as upper surface of the respective FBAR chips, and finally, a molding portion is formed so as to cover the protective structures.

6 Claims, 7 Drawing Sheets

FBAR BASED DUPLEXER DEVICE AND MANUFACTURING METHOD THEREOF

BACKGROUND OF THE INVENTION

1. Field of the Invention

The present invention relates to a duplexer device implemented by using a film bulk acoustic resonator (hereinafter, referred to as an FBAR), and a manufacturing method thereof, and more particularly to an FBAR based duplexer device, and a manufacturing method thereof, which can achieve miniaturization, and reduction of a manufacturing cost and enhancement of a yield due to a simplified process.

2. Description of the Related Art

In recent years, wireless communication devices have tended to become much leaner, and enhanced and diversified in their quality and functions due to the development of the communication industry. This recent trend sincerely requires miniaturization and enhancement in quality related with various elements for use in the wireless communication devices.

In order to satisfy such requirements to miniaturization, therefore, currently, active development is targeting studies for manufacturing essential components of wireless communication devices, such as a filter and a duplexer, by using FBARs. The FBARs are preferable for integration due to their thin film shapes, and have good properties.

Typically, the FBARs are usually formed in such a fashion that a piezoelectric layer is formed on a wafer, and upper and lower electrodes are formed at the upper and lower surfaces of the piezoelectric layer, respectively, for applying electricity to the piezoelectric layer so as to induce oscillation thereof. Further, a desired air gap is formed at the lower surface of the piezoelectric layer in order to improve a resonance property of the piezoelectric layer.

FIGS. 1A and 1B are sectional views, respectively, illustrating different structures of conventional duplexer devices implemented by using the FBARs formed as stated above.

The conventional FBAR based duplexer device shown in FIG. 1A comprises at least two FBARs 12, mounted on a substrate 11 serving as a lower support, for forming a Tx (transmitter) filter and an Rx (receiver) filter, respectively. The substrate 11 is formed with a common terminal and transmission/receiving terminals, and circuit patterns for electrically connecting the terminals to the Tx and Rx filters implemented by the FBARs. After the FBARs 12 are electrically connected to the circuit patterns formed at the substrate 11, in order to achieve a complete sealing of all of the FBARs 12, a molding portion 13 is formed on the substrate 11 by the use of certain sealing material.

As the substrate 11, due to the complexity of implemented circuits thereof, printed circuit board (PCB) type or low temperature co-fired ceramic (LTCC) type substrates are mainly used, but the PCB substrates are more preferable since they have many advantages, such as a low price, good properties and high productivity. In case of using the PCB substrates, as shown in FIG. 1A, it is necessary to provide certain protective structures on the FBARs 12, respectively, for protecting device functional portions, that is, piezoelectric layers, air gaps, and electrode layers, of the FBARs 12 from a molding process. These protective structures may be formed, for example, by processing a wafer having a certain thickness according to a wafer level package (WLP) technique, and bonding the processed wafer onto a substrate wafer of the corresponding FBAR.

In case that the FBARs 12 are formed with the protective structures, respetively, as stated above, however, the overall structure and manufacturing process of the FBARs 12 are disadvantageously complex, since the protective structures should be configured so as to be electrically connected to the device functional portions inside the FBARs 12, respectively, as well as protect the device functional portions.

When an FBAR is bonded to a substrate obtained by a wafer level package process, the obtained wafer level package type FBAR device has a very small size of about 1 millimeter in length and width. Due to the small size, a cap and substrate constituting the package has a sealing area corresponding to only about 30 to 100 square micrometers, with the exception of a driving portion. Since the FBAR device can endure only about 30° C. during its bonding process, there is a considerable restriction in a sealing method for securing a good reliability.

Even when a large amount of the FBAR devices are produced through any precision processes, due to a complexity in process thereof, it is difficult to obtain an appropriate yield.

In case that an LTCC technique is adopted in order to eliminate the above problems, as shown in FIG. 1B, first, a plurality of ceramic sheets are vertically laminated so as to form an LTCC substrate 15, which is defined therein with a cavity, and then a plurality of FBARs 16 are mounted inside the cavity defined in the LTCC substrate 15. After electrically connecting the FBARs 16 to the substrate 15 by bonding wires therebetween, a metal lead 17 is fused or seam-sealed on the LTCC substrate 15 above the FBARs 16.

In this case, since the LTCC substrate 15 is configured in such a fashion that circuits having a duplexing function are arranged therein in a multi-stage form, it is possible to achieve a reduction in size, compared with the case of using a single layer PCB substrate. Further, the LTCC substrate does not need a molding process. Furthermore, according to the structure of the LTCC substrate 15 as stated above, the LTCC substrate 15 already owns certain protective structures for protecting the FBARs 16. The protective structures are side walls obtained by defining the cavity in the substrate 15. Therefore, the LTC substrate 15 does not need separate protective structures. That is, the FBARs 16 only comprise an air gap, piezoelectric layer and electrode layers vertically arranged in series on an FBAR substrate wafer.

The LTCC technique, however, causes torsion of the LTCC substrate 15 during a LTCC firing process, resulting in a serious leak problem due to inferior bonding between the lead 17 and the LTCC substrate 15. Further, due to the fact that the LTCC substrate 15 is formed by vertically laminating a plurality of the ceramic sheets, there is a high possibility of producing any defects in the LTCC substrate itself.

Although the above techniques have been achieved according to a most effective method for miniaturization, since a possibility of inferiority due to complex processes always exists, it is difficult to secure a profit margin required for mass production, causing an unnecessarily high manufacturing cost, and to increase a possibility of producing inferior products due to an operator's carelessness.

SUMMARY OF THE INVENTION

Therefore, the present invention has been made in view of the above problems, and it is an object of the present invention to provide an FBAR based duplexer device, and a manufacturing method thereof, which can achieve miniaturization, and reduction of a manufacturing cost and enhancement of a yield due to a simplified process.

In accordance with one aspect of the present invention, the above and other objects can be accomplished by the provision of a method for manufacturing an FBAR based duplexer device comprising the steps of: a) preparing a plurality of FBAR chips, each FBAR chip comprising a substrate, air gap and piezoelectric layer unit, which are successively arranged, a plurality of electrode pads electrically connected to the piezoelectric layer unit, and bump balls formed on the electrode pads in a one to one ratio; b) preparing a duplexer substrate having a duplexing circuit; c) reversing a plurality of the FBAR chips after contacting them with the duplexer substrate so that the substrates of the FBAR chips face upward, and bonding the bump balls to the duplexer substrate; d) forming protective structures by the use of a film, the protective structures being positioned on side surfaces as well as an upper surface of the respective FBAR chips; and e) forming a molding portion on the duplexer substrate so as to cover the protective structures.

Preferably, the step a) may include the steps of: a-1) dividing an FBAR chip substrate wafer into a plurality of wafer sections by the use of vertical and horizontal lines, and forming a plurality of sacrificial layer units on the divided wafer sections, respectively; a-2) forming the piezoelectric layer units on the sacrificial layer units, respectively; a-3) forming a plurality of the electrode pads on each wafer section, the electrode pads being electrically connected to the piezoelectric layer unit of the corresponding wafer section; a-4) forming the air gaps by removing the sacrificial layer units; a-5) forming the bump balls on the electrode pads in a one to one ratio; and a-6) cutting the FBAR chip substrate wafer into the divided wafer sections, thereby obtaining a plurality of the individual FBAR chips.

Preferably, the step d) may include the steps of: d-1) laminating a dry film on an overall surface of the duplexer substrate and hence the FBAR chips; and d-2) removing unnecessary portions of the dry film laminated on the duplexer substrate.

Preferably, the duplexer substrate may be made of PCB sheets.

Preferably, the dry film may be an insulation film including a photosensitive polymer film or a non-photosensitive polymer film.

Preferably, the step d-2) may include the steps of: d-2-1) exposing the unnecessary portions of the dry film to be removed to a light, through the use of a mask; and d-2-2) removing the exposed portions of the dry film by simultaneously applying a chemical process using a developer solution and a physical process using high pressure dispensing.

In accordance with another aspect of the present invention, the above and other objects can be accomplished by the provision of an FBAR based duplexer device comprising: a PCB substrate having a duplexing circuit; a plurality of FBAR chips, each comprising an FBAR chip substrate, an air gap defined at a lower surface of the FBAR chip substrate, a piezoelectric layer unit formed under the air gap, a plurality of electrode pads provided at a lower side of the FBAR chip substrate so as to be electrically connected to the piezoelectric layer unit, and a plurality of bump balls formed on a lower side of the electrode pads so as to be bonded to an upper surface of the PCB substrate; protective structures made of a film, the protective structures being laminated on the PCB substrate so as to cover side surfaces and upper surfaces of the respective FBAR chips; and a molding portion formed on the PCB substrate so as to completely cover the protective structures.

Preferably, the protective structures may be made of an insulation film including a photosensitive polymer film and a non-photosensitive polymer film, and laminated on the PCB substrate by using a vacuum deposition.

BRIEF DESCRIPTION OF THE DRAWINGS

The above and other objects, features and other advantages of the present invention will be more clearly understood from the following detailed description taken in conjunction with the accompanying drawings, in which.

DESCRIPTION OF THE PREFERRED EMBODIMENTS

Now, an FBAR based duplexer device, and a manufacturing method thereof according to the present invention will be described, with reference to the accompanying drawings.

Figure 1A:
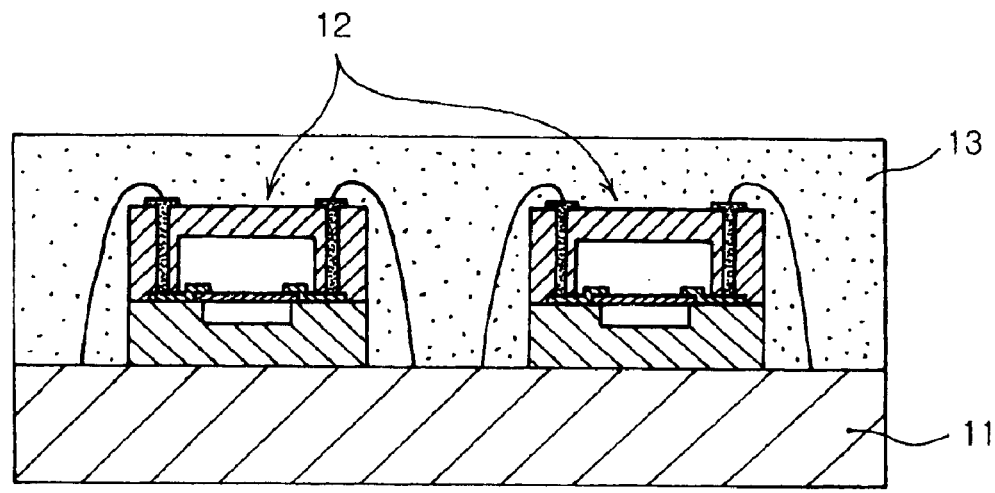
FIGS. 1A and 1B are sectional views, respectively, illustrating conventional FBAR based duplexer devices.
Figure 1B:
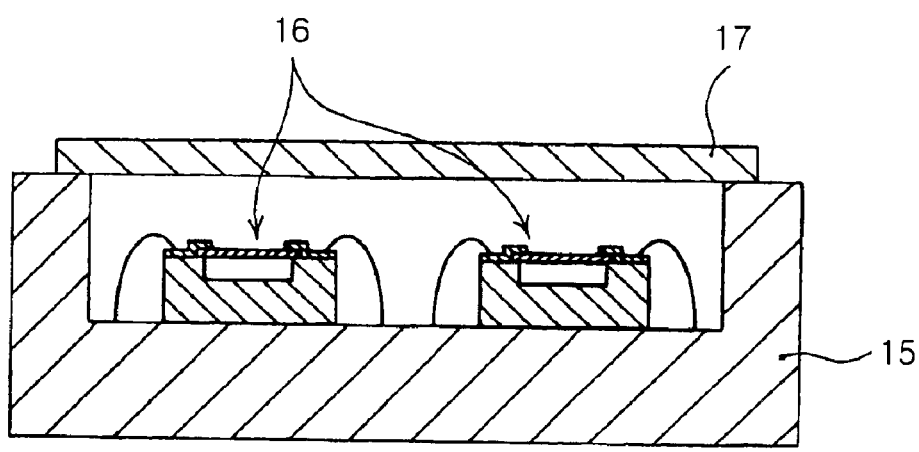
Figure 2:
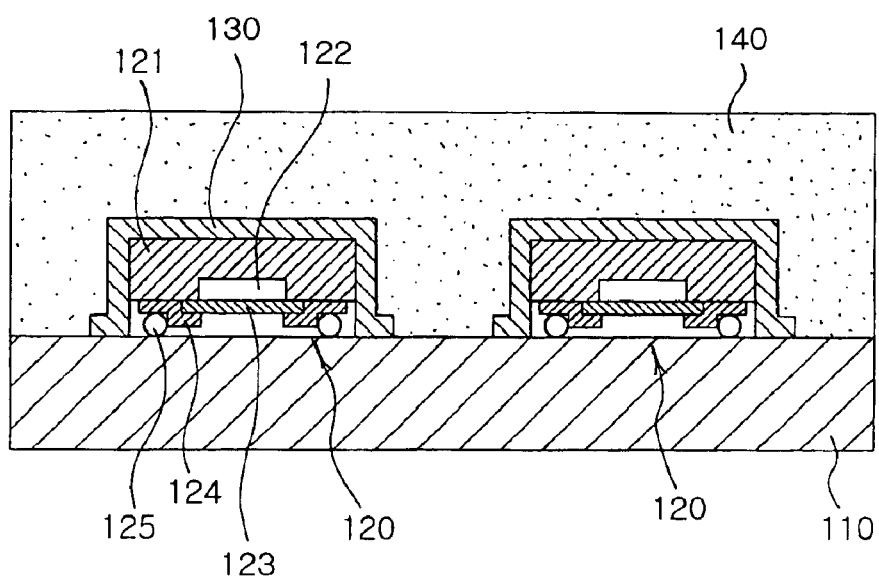
FIG. 2 is a sectional view illustrating an FBAR based duplexer device in accordance with the present invention.

As shown in FIG. 2 illustrating the sectional structure of the FBAR based duplexer device in accordance with the present invention, the FBAR based duplexer device of the present invention comprises a substrate 110 serving as a lower support, a plurality of FBAR chips 120 mounted on the substrate 110 in a flip chip bonding manner and adapted to form Tx and Rx filters, respectively, a plurality of protective structures, made of films, for wholly covering the upper and side surfaces of the respective FBAR chips 120, and a molding portion 140 formed on the substrate 110 so as to enable the protective structures 130 to be completely covered. The substrate 110 is formed with a common terminal and transmission/receiving terminals and circuit patterns for electrically connecting the terminals to the Tx and Rx filters embodied by the FBAR chips 120.

The substrate 110 may be freely selected from among various kinds of substrates including a PCB substrate or LTCC substrate so long as it allows the formation of circuits thereon, however, it is more preferable to use the PCB substrate in view of cost or productivity. In particular, the PCB substrate may be formed by stacking a plurality of PCB sheets in a multi-layer structure, so that the respective sheets are regularly arranged in vertical and horizontal lines.

Each of the FBAR chips 120 comprises a certain sized FBAR chip substrate 121 defined at the bottom portion thereof with an air gap 122, a piezoelectric layer unit 123 formed at the lower surface of the FBAR chip substrate 121 so as to be positioned under the air gap 122, a plurality of electrode pads 124 formed at the lower surface of the FBAR chip substrate 121 and adapted to be electrically connected with the piezoelectric layer unit 123 for performing input and output of signals, and a plurality of bump balls 125 formed at the lower side of the electrode pads 124 in a one to one ratio. These bump balls 125 are bonded onto the substrate 110 of the FBAR based duplexer device.

That is, the FBAR chip 120 comprises the FBAR chip substrate 121, air gap 122, and piezoelectric layer unit 123, which are successively arranged. After the bump balls 125 are formed, respectively, at the electrode pads 124, which are provided so as to be electrically connected to the piezoelectric layer unit 123, the FBAR chip 120 is reversed so that the FBAR chip substrate 121 is located at the uppermost position. In this case, the FBAR chips 406 face upward, and the substrate 110 of the FBAR based duplexer device faces downward.

In this case, since the FBAR chip substrate 121 is located at the uppermost position, the FBAR chip substrate 121 can serve as an upper cover of the FBAR chip 120. Further, due to the bump balls 125 having a certain thickness, there exists a certain gap between the duplexer substrate 110 and the piezoelectric layer unit 123 of the FBAR chip 120.

When it is desired to form the protective structure 130 by coating a certain dry film on the FBAR chip 120, which is mounted on the duplexer substrate 110 in a flip chip bonding manner, the protective structure 130 is adapted to be supported by the substrate 121 of the FBAR chip 120. Therefore, since it is unnecessary to form separate side walls around the FBAR chip 120, the formation of the protective structure 130 can be achieved with a single process.

The protective structure 130 is obtained by processing an insulation film selected from among various kinds of insulation films including a photosensitive polymer film or a non-photosensitive polymer film. Since the protective structure 130 is molded and processed according to general thin-film processes including laminating, light-exposure, developing, hardening, and the like, it is possible to achieve precision processing thereof, and to simplify its overall manufacturing process compared with a wafer level package thus reducing the rate of generation of inferior products. Further, in comparison with the wafer level package having a complexity in its manufacturing process, a yield and productivity thereof are improved while an overall manufacturing cost is reduced. Furthermore, by additionally performing an ultraviolet exposure process in a state wherein a certain insulation film is coated on the FBAR chip 120, it is possible to increase the overall strength thereof.

The molding portion 140 of the FBAR based duplexer device is obtained by applying a sealing material and the like on the duplexer substrate 110 so as to completely cover all of the FBAR chips 120, and hardening the applied sealing material.

As stated above, since the FBAR chip of the present invention comprises a certain protective space for securing the normal function of the piezoelectric layer unit 123 and the like by virtue of the thickness of the bump balls 125, and the protective structure 130, made of an insulation film, seals the certain protective space from the outside, the FBAR chip 120 can be protected from any external stimulations generated during the formation of the molding portion 140.

Figure 3:
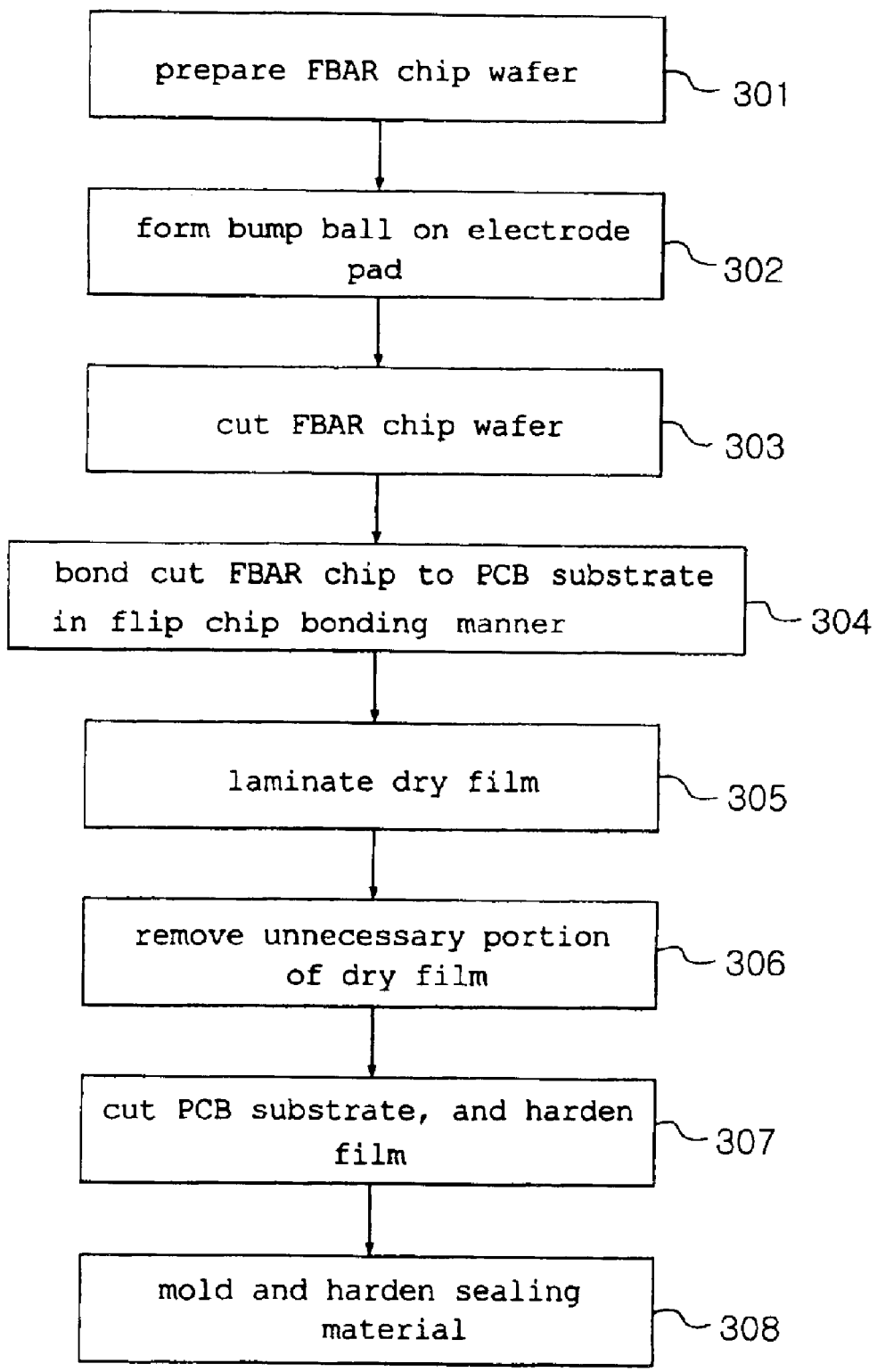
FIG. 3 is a flow chart illustrating a method for manufacturing the FBAR based duplexer device in accordance with the present invention.

FIG. 3 is a flow chart illustrating a method for manufacturing the FBAR based duplexer device in accordance with the present invention.

Figure 4A:
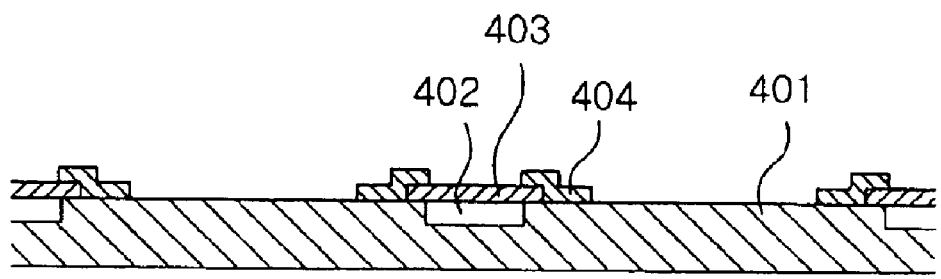
FIGS. 4A and 4H are sectional views, respectively, illustrating the sequential steps of manufacturing the FBAR based duplexer device in accordance with the present invention.
Figure 4B:
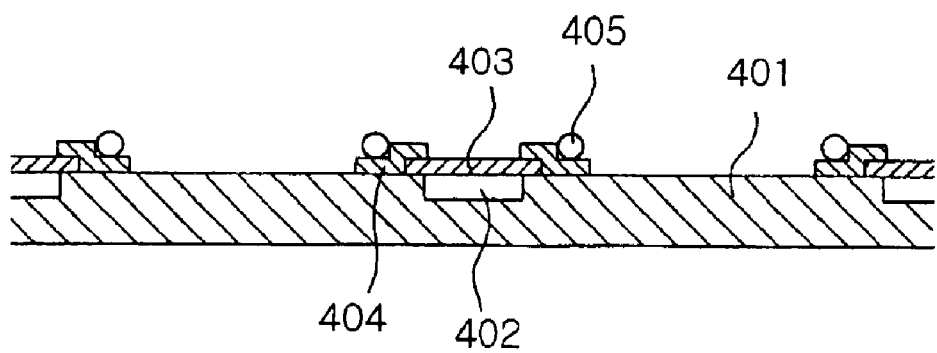
Figure 4C:
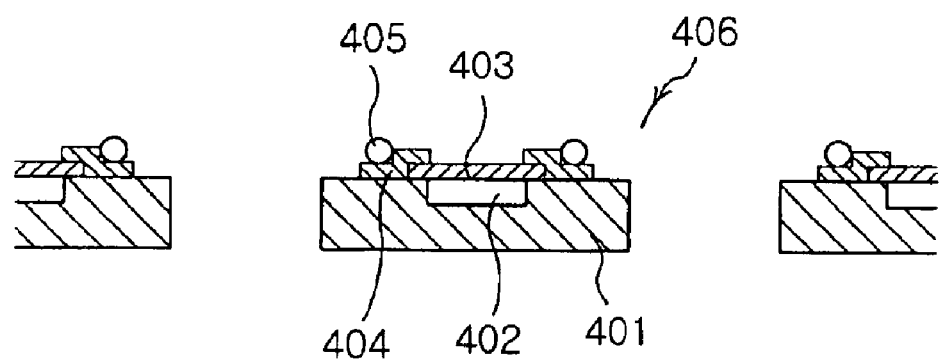
Figure 4D:
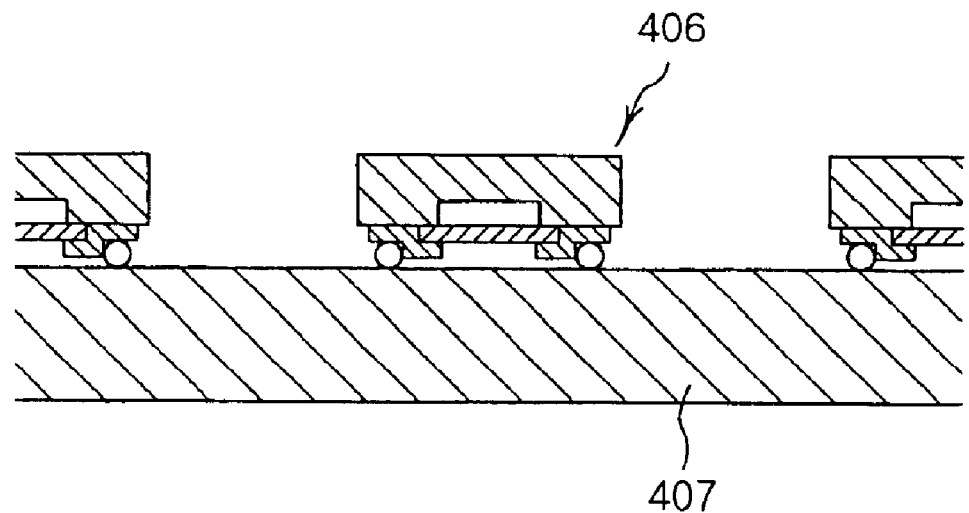
Figure 4E:
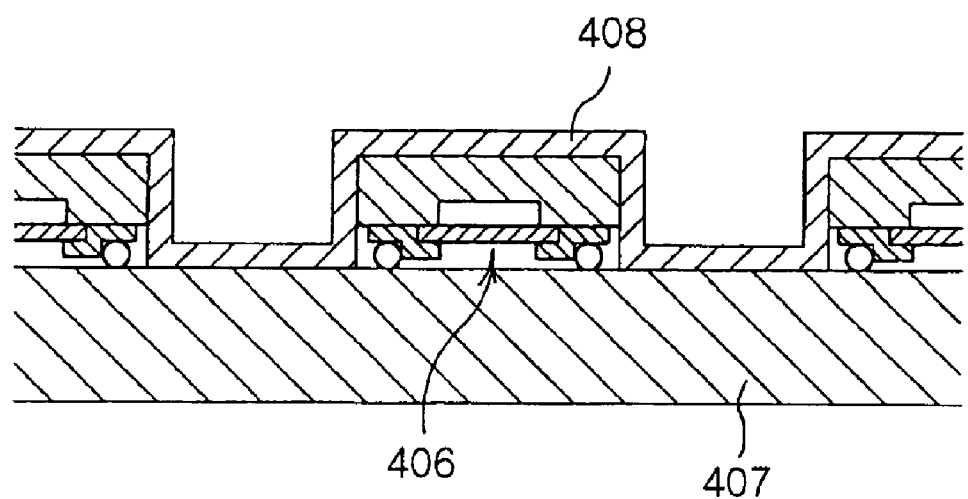
Figure 4F:
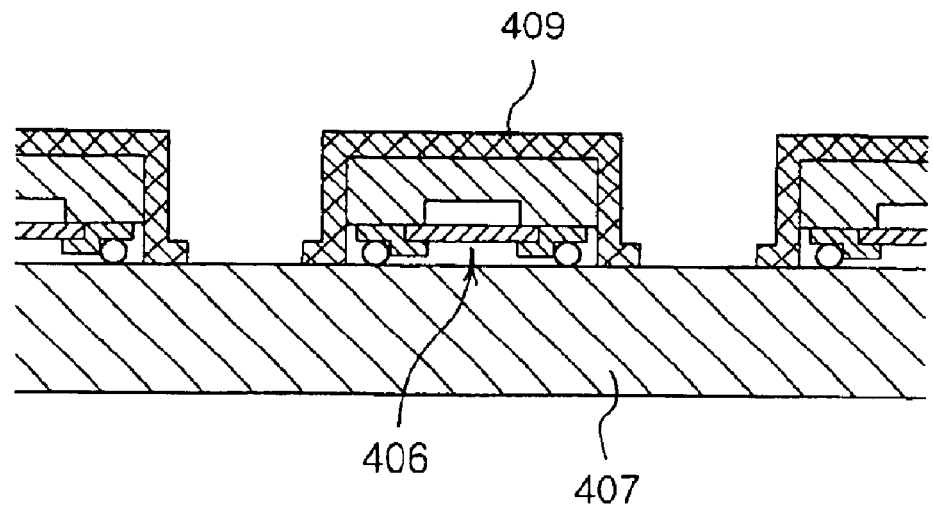
Figure 4G:
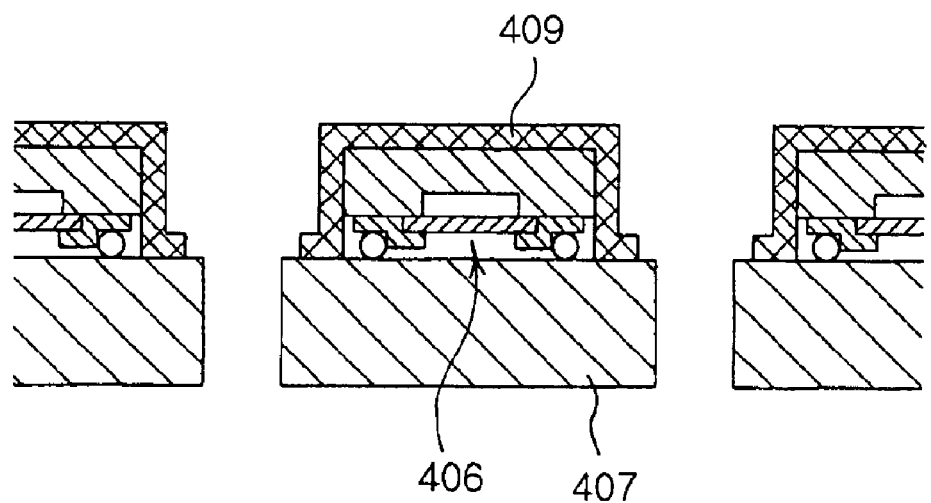
Figure 4H:
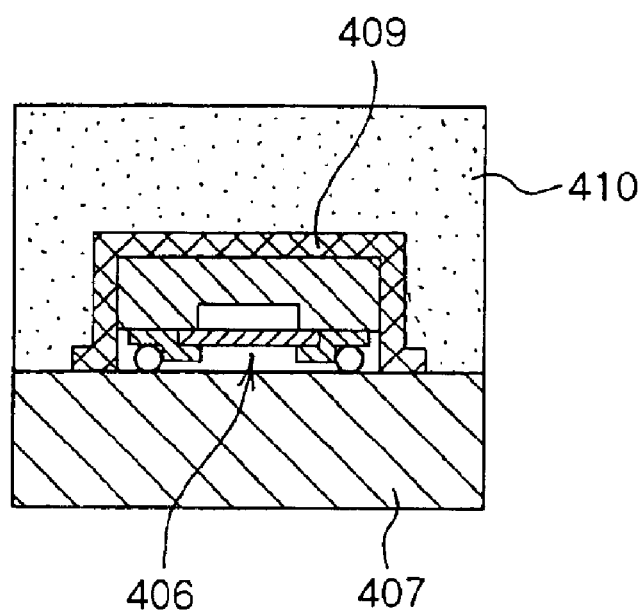

FIGS. 4A and 4H are sectional views, respectively, illustrating the sequential steps of manufacturing the FBAR based duplexer device in accordance with an embodiment of the present invention.

Now, a manufacturing method of the FBAR based duplexer device in accordance with the present invention will be explained with reference to FIGS. 3, and 4A to 4H.

For manufacturing the FBAR based duplexer device of the present invention, first, there is provided an FBAR chip wafer comprising a plurality of air gaps, piezoelectric layer units, and electrode pads, which are arranged at regular distances (step 301).

Referring to FIG. 4A, the FBAR chip wafer, designated as reference numeral 401, is formed with air gaps 402, piezoelectric layer units 403, and electrode pads 404. These air gaps 402, piezoelectric layer units 403, and electrode pads 404 can be formed by using various known methods. For example, an FBAR chip wafer having a certain area is first divided into a plurality of wafer sections by the use of vertical and horizontal lines, and the respective wafer sections are formed with sacrificial layer units, respectively. Then, piezoelectric layer units are formed on the sacrificial layer units, respectively, and subsequently a plurality of electrode pads are formed on each wafer section so as to be electrically connected to the piezoelectric layer unit provided on the wafer section. After that, the sacrificial layer units are removed so as to form air gaps, which are vertically aligned with the piezoelectric layer units.

Referring to FIG. 4B, on the electrode pads 404 of the FBAR chip wafer 401 are formed bump balls 405, respectively (step 302).

As can be seen from the above description, the formation of the bump balls 405 at the level of the FBAR chip wafer 401 can be achieved through a single process, regardless of the number of the FBAR chips. This is more advantageous than a conventional method wherein the bump balls are formed at individual FBAR chips, respectively.

After that, as shown in FIG. 4C, the FBAR chip wafer 401, which is formed with the air gaps 402, piezoelectric layer units 403, electrode pads 404 and bump balls 405, is cut along predetermined vertical and horizontal cutting lines as boundary lines between the divided wafer sections, thereby forming a plurality of individual FBAR chips 406 (step 303).

When a plurality of the FBAR chips 406 having a desired resonance property are prepared according to the above steps 301 to 303, the FBAR chips 406 are reversed at their original positions, thereby allowing their bump balls 405 to be bonded to a duplexer substrate 407 (step 304). In this state, the bump balls 405 of the FBAR chips 406 face downward, and their FBAR chip wafers 401 face upward. FIG. 4D illustrates the FBAR chips 406 bonded to the duplexer substrate 407 in a flip chip bonding manner.

Upon completion of such flip chip bonding, as shown in FIG. 4E, a dry film 408 is laminated over the duplexer substrate 407 and hence a plurality of the FBAR chips 406 (step 305). In this case, as the laminating process is performed by the use of a vacuum laminator, the dry film 408 can be coated over the side surfaces as well as upper surfaces of the FBAR chips 406.

Then, as shown in FIG. 4F, certain portions of the laminated dry film 408, located on the duplexer substrate 407, are removed so as to expose portions of the electrode pads 404 to the outside, through the use of a mask (step 306). In this case, for the removal of the exposed portions of the dry film 408, a chemical process using a developer solution and a physical process using a high pressure dispensing may be simultaneously applied.

The duplexer substrate 407 undergoes a dicing process as shown in FIG. 4G, thereby achieving the removal of any frequencies and other factors effecting properties of a resultant duplexer device. Subsequently, the duplexer substrate 407 is exposed to ultraviolet rays, so as to allow a film 409 laminated thereon to be hardened (step 307).

Finally, as a certain sealing material is molded and hardened on the diced duplexer substrate 407, the FBAR based duplexer device packaged as shown in FIG. 4H is manufactured (step 308).

As apparent from the above description, the present invention provides an FBAR chip comprising a protective space via the use of a dry film and a flip chip bonding manner, resulting in an enhancement in a sealing degree compared with conventional techniques. Further, according to the present invention, the FBAR chip comprises a protective structure, which is configured in such a fashion that its side surfaces and upper surface are simultaneously formed with a single process, thereby achieving a simplification in a manufacturing process thereof thus increasing a yield while reducing overall manufacturing cost.

Although the preferred embodiments of the present invention have been disclosed for illustrative purposes, those skilled in the art will appreciate that various modifications, additions and substitutions are possible, without departing from the scope and spirit of the invention as disclosed in the accompanying claims.

What is claimed is:

1. A method for manufacturing an FBAR based duplexer device comprising the steps of:
   a) preparing a plurality of FBAR chips, each FBAR chip comprising a substrate, air gap and piezoelectric layer unit, which are successively arranged, a plurality of electrode pads electrically connected to the piezoelectric layer unit, and bump balls formed on the electrode pads in a one to one ratio;
   b) preparing a duplexer substrate having a duplexing circuit;
   c) reversing a plurality of the FBAR chips after contacting them with the duplexer substrate so that the substrates of the FBAR chips face upward, and bonding the bump balls to the duplexer substrate;
   d) forming protective structures by the use of a film, the protective structures being positioned on side surfaces as well as an upper surface of the respective FBAR chips; and
   e) forming a molding portion on the duplexer substrate so as to cover the protective structures.

2. The method as set forth in claim 1, wherein the step a) includes the steps of:
   a-1) dividing an FBAR chip substrate wafer into a plurality of wafer sections by the use of vertical and horizontal lines, and forming a plurality of sacrificial layer units on the divided wafer sections, respectively;
   a-2) forming the piezoelectric layer units on the sacrificial layer units, respectively;
   a-3) forming a plurality of the electrode pads on each wafer section, the electrode pads being electrically connected to the piezoelectric layer unit of the corresponding wafer section;
   a-4) forming the air gaps by removing the sacrificial layer units;
   a-5) forming the bump balls on the electrode pads in a one to one ratio; and
   a-6) cutting the FBAR chip substrate wafer into the divided wafer sections, thereby obtaining a plurality of the individual FBAR chips.

3. The method as set forth in claim 1, wherein the step d) includes the steps of:
   d-1) laminating a dry film on an overall surface of the duplexer substrate and hence the FBAR chips; and
   d-2) removing unnecessary portions of the dry film laminated on the duplexer substrate.

4. The method as set forth in claim 1, wherein the duplexer substrate is made of PCB sheets.

5. The method as set forth in claim 3, wherein the dry film is an insulation film including a photosensitive polymer film or a non-photosensitive polymer film.

6. The method as set forth in claim 3, wherein the step d-2) includes the steps of:
   d-2-1) exposing the unnecessary portions of the dry film to be removed to a light, through the use of a mask; and
   d-2-2) removing the exposed portions of the dry film by simultaneously applying a chemical process using a developer solution and a physical process using high pressure dispensing.

* * * * *